United States Patent
Kim et al.

(10) Patent No.: US 8,585,391 B2
(45) Date of Patent: Nov. 19, 2013

(54) PHOTOMASK CLEANING APPARATUS AND METHODS OF CLEANING A PHOTOMASK USING THE SAME

(75) Inventors: Jin-Ho Kim, Hwaseong-si (KR); Yo-Han Ahn, Yongin-si (KR); Jeong-In Yoon, Hwaseong-si (KR); Ji-Young Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 140 days.

(21) Appl. No.: 13/238,805

(22) Filed: Sep. 21, 2011

(65) Prior Publication Data

US 2012/0219654 A1 Aug. 30, 2012

(30) Foreign Application Priority Data

Feb. 25, 2011 (KR) .................... 10-2011-0017430

(51) Int. Cl.
*G03F 1/82* (2012.01)
*G03F 1/62* (2012.01)

(52) U.S. Cl.
USPC ........................................ 425/174.4; 430/5

(58) Field of Classification Search
USPC ........... 430/5, 30; 134/1; 425/174.4; 356/318
See application file for complete search history.

(56) References Cited

U.S. PATENT DOCUMENTS

| 5,386,430 A * | 1/1995 | Yamagishi et al. ............. 372/57 |
| 2003/0127441 A1* | 7/2003 | Haight et al. ............ 219/121.84 |
| 2008/0264441 A1* | 10/2008 | Takagi ............................... 134/1 |

FOREIGN PATENT DOCUMENTS

| JP | 2001-005167 | 1/2001 |
| KR | 1020060126267 A | 12/2006 |
| KR | 1020080062760 A | 7/2008 |
| KR | 1020090103203 A | 10/2009 |

* cited by examiner

*Primary Examiner* — Stephen Rosasco
(74) *Attorney, Agent, or Firm* — Myers Bigel Sibley & Sajovec, PA

(57) ABSTRACT

A photomask cleaning apparatus includes a photomask receiving stage and a laser supply unit. The photomask receiving stage is configured to receive and retain a photomask in a desired orientation. The photomask has a front face having a pellicle adhesive residue region thereon. The desired orientation is with the front face positioned to allow gravity to move particles on the front face away from the front face without interference from the front face of the photomask. The laser supply unit is configured to generate a laser beam that irradiates a target region on the front face of the photomask to remove a pellicle adhesive residue from the target region. The photomask cleaning apparatus is configured to move the target region on the front face of the photomask to irradiate the entire pellicle adhesive residue region. Methods of using the photomask cleaning apparatus are also provided.

17 Claims, 7 Drawing Sheets

PHOTOMASK CLEANING APPARATUS AND METHODS OF CLEANING A PHOTOMASK USING THE SAME

CROSS-REFERENCE TO RELATED APPLICATION

This application claims priority under 35 U.S.C. 119 from Korean Patent Application No. 10-2011-0017430 filed on Feb. 25, 2011 in the Korean Intellectual Property Office, the contents of which application, in its entirety, are herein incorporated by reference.

BACKGROUND

The present inventive concept relates to a photomask cleaning apparatus and methods of cleaning a photomask using the same.

In general, a photolithography process may be used to form a predetermined pattern on a semiconductor substrate. For example, a photoresist pattern may be formed by transferring a pattern of a photomask to a photoresist layer on a semiconductor substrate. Then, a semiconductor substrate or a material layer formed on a semiconductor substrate may be etched using the photoresist pattern to form a predetermined pattern.

The photomask is a mask used to form a photoresist pattern on a semiconductor substrate, and may be configured, generally, by forming a light shielding pattern made of a material such as chromium (Cr) on a transparent substrate such as quartz. The photomask having the light shielding pattern may be exposed to light to transfer an image of the light shielding pattern onto the photoresist on the semiconductor substrate.

In this case, a pellicle for protecting the light shielding pattern may be formed to prevent a foreign substance from adhering to the light shielding pattern formed on the photomask. An adhesive may be used to fix the pellicle onto the photomask. Namely, the pellicle may be adhered to the photomask by using an adhesive.

However, a foreign substance may still adhere to the surface of the pellicle during the photolithography process. Accordingly, it is generally replaced with a new pellicle for the same photomask. In this case, after removing the previously used pellicle, a residue of the pellicle adhesive typically remains on the surface of the photomask that generally should be removed.

SUMMARY

In other embodiments, the laser supply unit is configured to generate the laser beam having a wavelength selected to irradiate a selected pellicle adhesive residue material having a desired reflectivity to the selected pellicle adhesive residue material to limit damage caused to the photomask by the laser beam and to limit thermal removal of the pellicle adhesive residue and initiate a physical removal process that removes the pellicle adhesive residue. The wavelength may be from about 193 nanometers (nm) to about 355 nm. The laser supply unit may includes a nanosecond pulse laser that generates the laser beam to have a pulse duration from about 1 nanoseconds (ns) to about 50 ns to limit thermal damage to the photomask from the laser beam. The photomask cleaning apparatus may be configured to completely remove the pellicle adhesive residue from the pellicle adhesive residue region using the laser supply unit without using an additional cleaning solution.

In further embodiments, a residue inspection unit coupled to the laser supply unit is configured to detect when the pellicle adhesive residue is present in the pellicle adhesive residue region. The laser supply unit is configured to generate the laser beam only when the pellicle adhesive residue is detected by the residue inspection unit.

In other embodiments, an endpoint determination unit is coupled to the laser supply unit that is configured to detect when the laser beam has stopped removing the pellicle adhesive residue from the target region. The laser supply unit is configured to stop generating the laser beam when the endpoint determination unit detects that the laser beam has stopped removing the pellicle adhesive residue from the target region. The endpoint determination may be at least one of an optical sensor configured to detect light generated when the laser beam removes the pellicle adhesive residue and a sound sensor configured to detect sound generated when the laser beam removes the pellicle adhesive residue.

In further embodiments, a suction unit proximate the target region is configured to remove airborne debris generated when the laser beam removes the pellicle adhesive residue. The photomask may include a region in which a pattern is formed and the pellicle adhesive region extends around at least a portion of the region in which the pattern is formed. The desired orientation may be the gravity direction. The photomask cleaning apparatus may include a stage moving unit configured to move the stage relative to the laser beam to move the target region on the front face of the photomask over the entire pellicle adhesive residue region.

In yet other embodiments, a photomask cleaning apparatus includes a photomask receiving stage, a laser supply unit and a suction unit. The photomask receiving stage is configured to receive and retain a photomask in a desired orientation. The photomask has a front face having a pellicle adhesive residue region thereon. The laser supply unit is configured to generate a laser beam that irradiates a target region on the front face of the photomask to remove a pellicle adhesive residue from the target region. The photomask cleaning apparatus is configured to move the target region on the front face of the photomask to irradiate the entire pellicle adhesive residue region. The suction unit is proximate the target region and is configured to remove airborne debris generated when the laser beam removes the pellicle adhesive residue.

In further embodiments, the suction unit includes a plurality of suction inlets arranged symmetrically proximate the target region.

In other embodiments, a method of cleaning a photomask includes placing a photomask in a desired orientation in a photomask receiving stage of a photomask cleaning apparatus. The photomask has a front face having a pellicle adhesive residue region thereon. The desired orientation is with the front face positioned to allow gravity to move particles on the front face away from the front face without interference from the front face of the photomask. A laser beam is oriented on a target region of the pellicle adhesive residue region. The target region is irradiated using the laser beam to remove a pellicle adhesive residue from the target region. The laser beam is re-oriented to direct the target region to another region of the pellicle adhesive residue region. The another region of the pellicle adhesive residue region is irradiated to remove a pellicle adhesive residue from the another region. Re-orienting the laser beam to direct the target region to another region and irradiating the another region are repeated until all pellicle adhesive residue has been removed from the pellicle adhesive region. Then the photomask is removed from the photomask receiving stage.

In some embodiments, radiating the target region using the laser beam includes irradiating the target region using the laser beam having a wavelength selected to irradiate a selected pellicle adhesive residue material having a desired reflectivity to the selected pellicle adhesive residue material to limit damage caused to the photomask by the laser beam and to limit thermal removal of the pellicle adhesive residue and initiate a physical removal process that completely removes the pellicle adhesive residue without using an additional solution.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
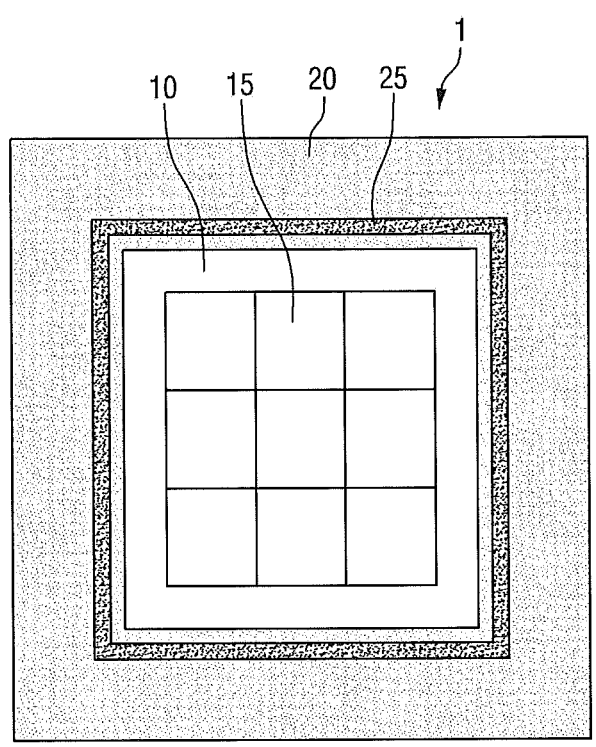
FIG. 1 is a top plan view schematically illustrating a photomask in accordance with some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a photomask cleaning apparatus and a method of cleaning a photomask using the photomask cleaning apparatus in accordance with some embodiments of the present inventive concept will be described with reference to FIGS. 1 to 8.

Figure 2:
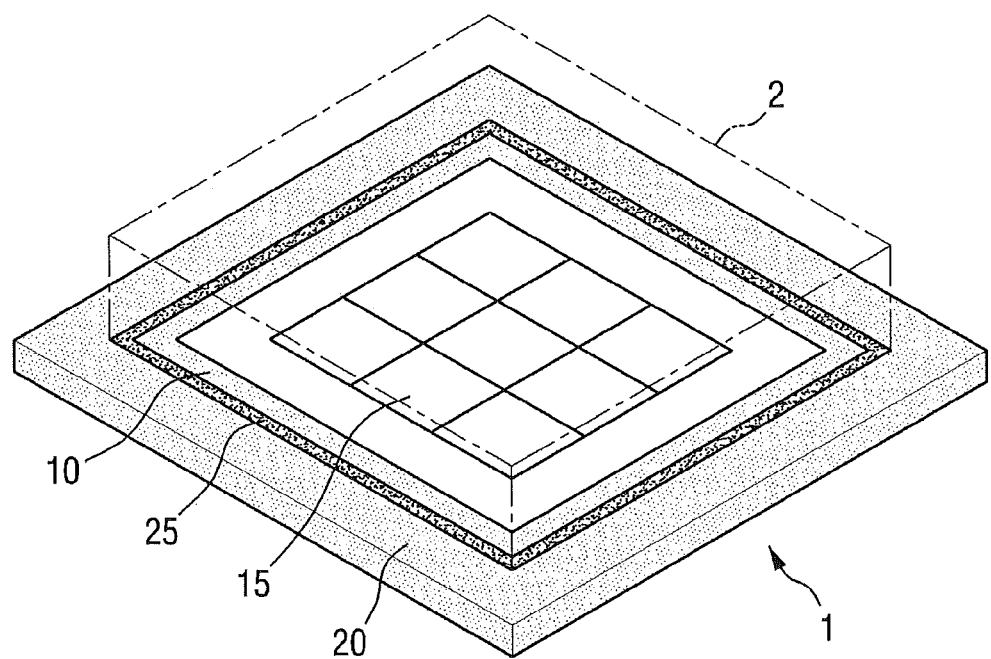
FIG. 2 is a perspective view illustrating a pellicle adhered to the photomask of FIG. 1.
Figure 3:
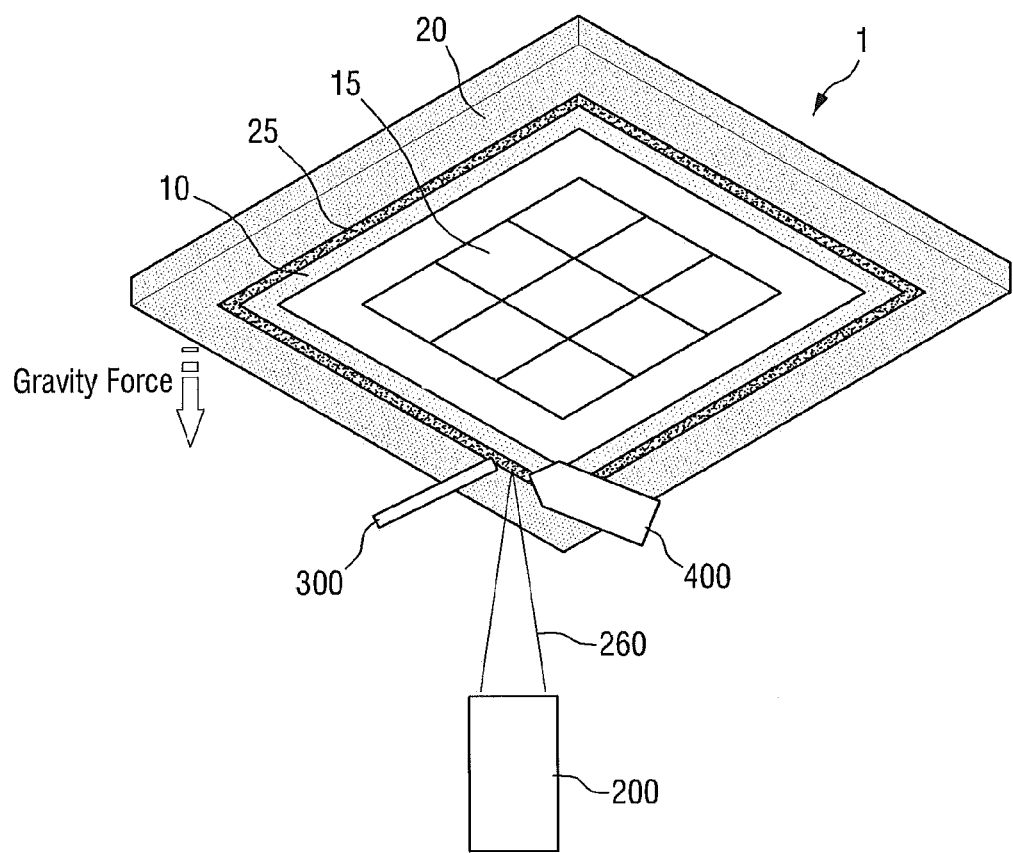
FIG. 3 is a perspective view schematically illustrating a photomask cleaning apparatus in accordance with some embodiment of the present inventive concept.

FIG. 1 schematically shows a photomask in accordance with some embodiments of the present inventive concept. FIG. 2 is a diagram for explaining a state in which a pellicle is adhered to the photomask. FIG. 3 is a conceptual diagram for explaining a photomask cleaning apparatus in accordance with some embodiments of the present inventive concept.

Figure 4:
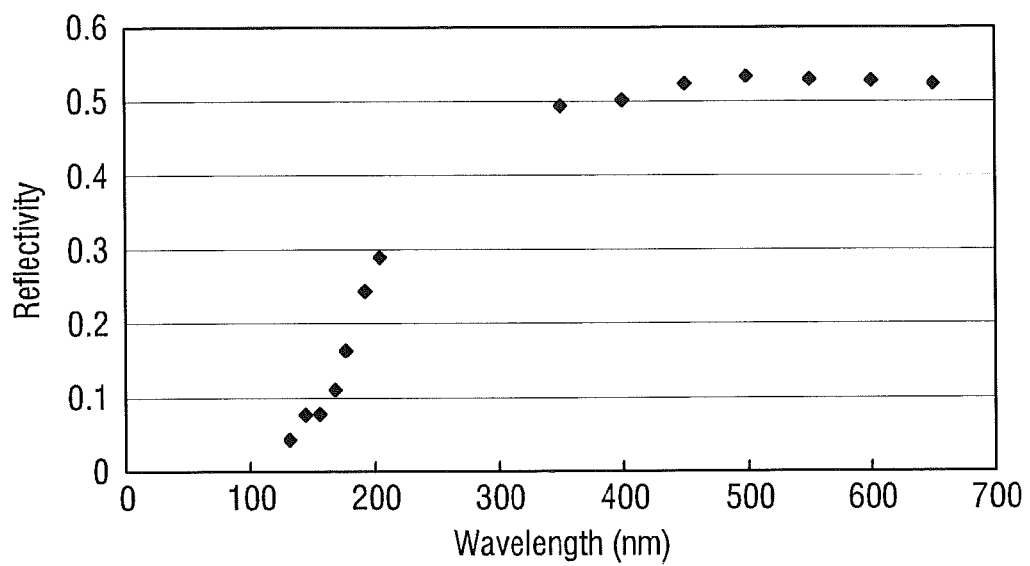
FIG. 4 is a graph illustrating reflectivity for a wavelength range of a laser beam used in the photomask cleaning apparatus of FIG. 3.
Figure 5:
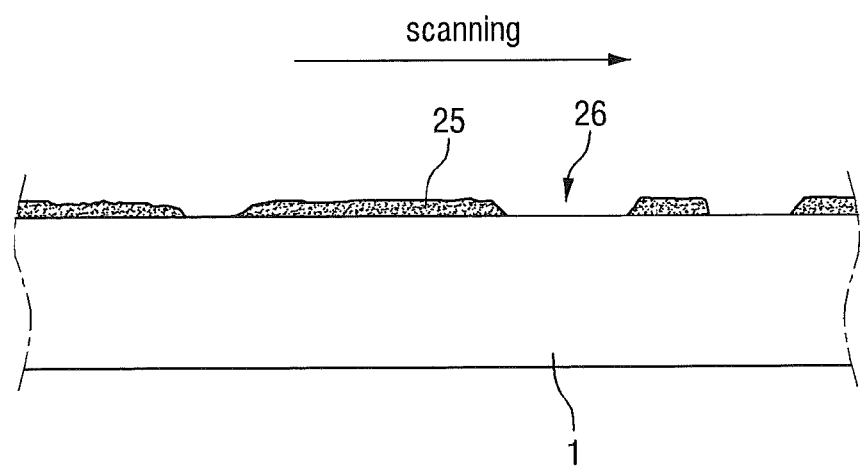
FIGS. 5 to 7 are partial side views schematically illustrating the photomask cleaning apparatus of FIG. 3 and methods for using the same.
Figure 6:
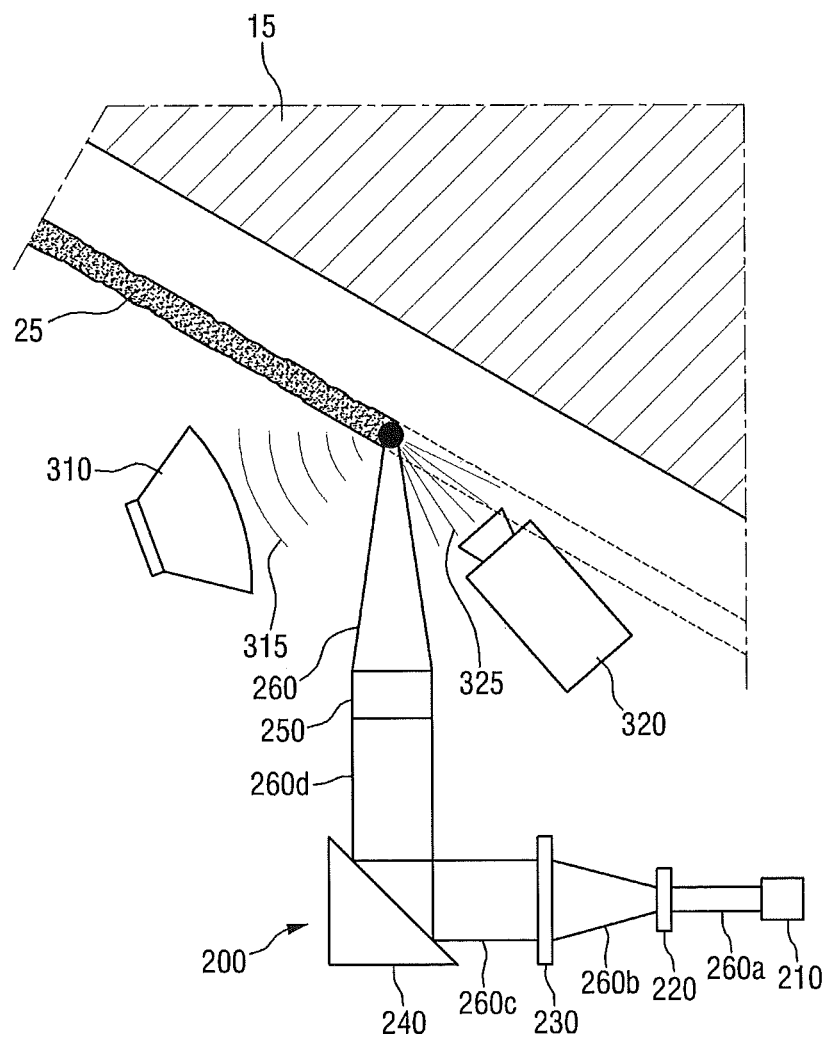
Figure 7:
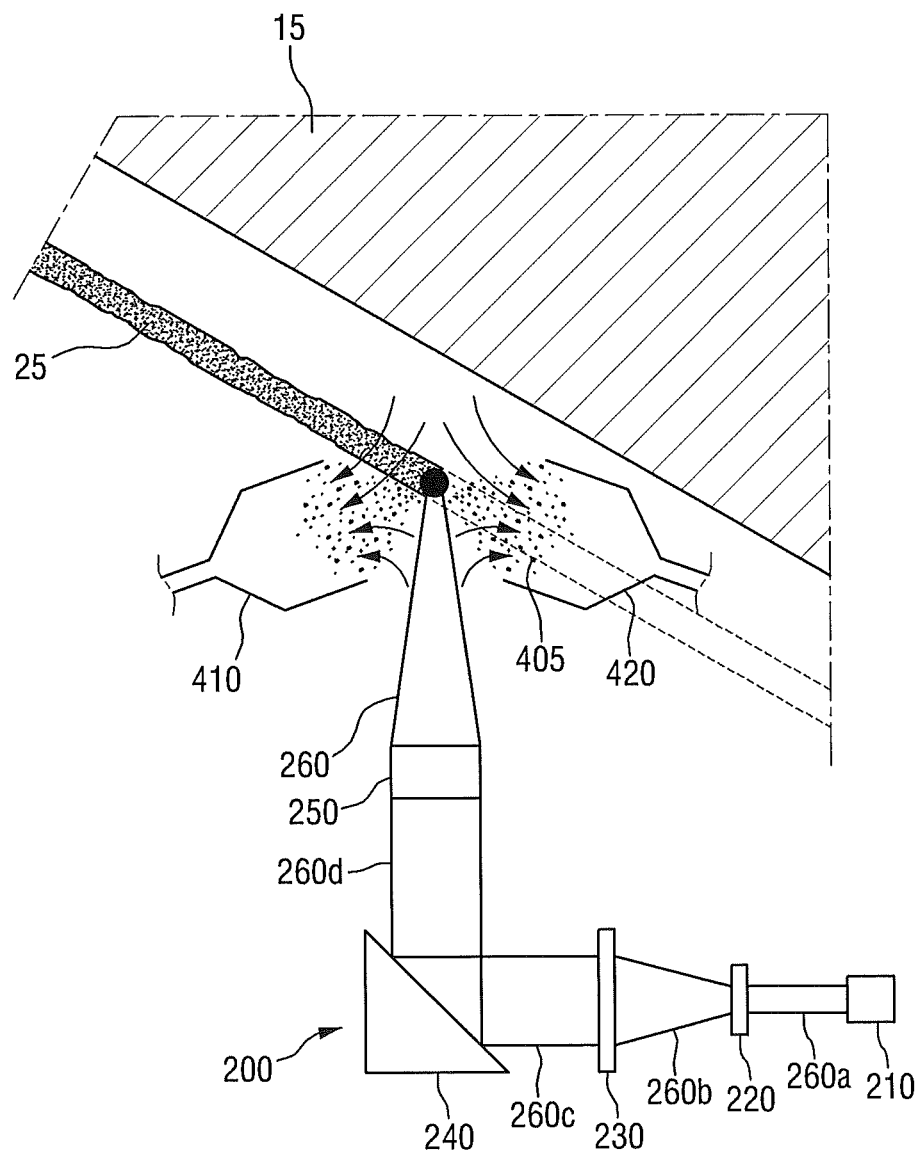
Figure 8:
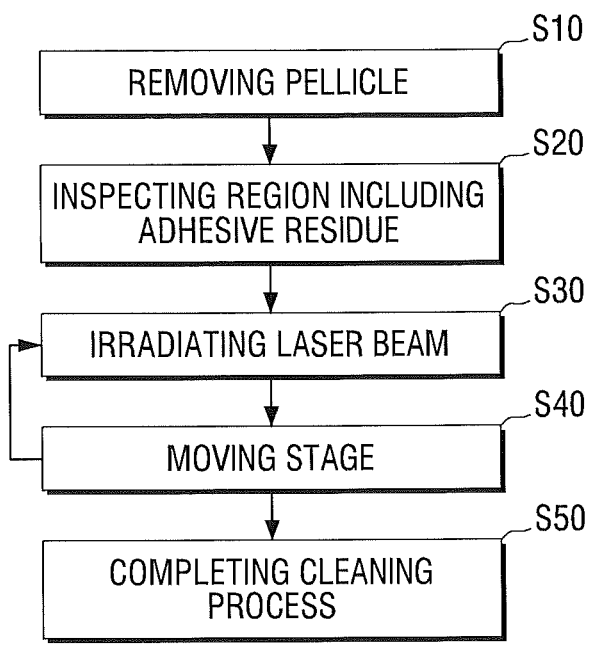
FIG. 8 is a flowchart of a photomask cleaning method using the photomask cleaning apparatus of FIG. 3 in accordance with some embodiments of the present inventive concept.

FIG. 4 is a graph for explaining a wavelength range of a laser beam used in the photomask cleaning apparatus of FIG. 3. FIGS. 5 to 7 are conceptual diagrams for explaining an operation method of the photomask cleaning apparatus of FIG. 3. FIG. 8 shows a flowchart for explaining a photomask cleaning method using the photomask cleaning apparatus in accordance with some embodiments of the present inventive concept.

Referring to FIG. 1, one surface of a photomask 1 may include a first region 10 and a second region 20. The illustrated first region 10 is, for example, a region in which a predetermined pattern 15 is formed on one surface of the photomask 1. The second region 20 is a peripheral region of one surface of the photomask 1 that, in the illustrated embodiments, surrounds the first region 10. A removal target substance (i.e., a substance that is to be removed from the photomask 1) is in the second region 20. Specifically, the second region 20 may be a region including a removal target substance 25 that is to be removed in a cleaning process of a photomask in accordance with some embodiments of the present inventive concept.

As shown in FIG. 1, the photomask 1 may include the first region 10 in which the pattern 15 is formed and the second region 20 in which the removal target substance 25 exists, and the second region 20 may be located outside the first region 10. More specifically, the second region 20 may be formed around the first region 10.

The removal target substance 25 may be, for example, a residue of a pellicle adhesive. Further, although the removal target substance 25 is shown as having a rectangular shape in the drawing, the present inventive concept is not limited thereto.

As shown in FIG. 2, a pellicle 2 is a protection film adhered onto a pattern surface of the photomask 1 in order to limit or even prevent the pattern 15 formed on the photomask 1 from being contaminated, i.e., to prevent a foreign substance from being adhered to the photomask 1. In this case, the pellicle 2 may be adhered to one surface of the photomask 1 on which the pattern 15 is formed using a specific adhesive.

After the pellicle 2 is removed as needed, e.g., due to replacement of the pellicle 2, the removal target substance (pellicle adhesive residue) 25 may remain on the second region 20 of the photomask 1. Although a case where the removal target substance 25 is a residue of the pellicle adhesive is exemplarily described below, the present inventive concept is not limited thereto.

Referring to FIG. 3, the photomask cleaning apparatus in accordance with some embodiments of the present inventive concept includes a photomask receiving region/stage configured to receive and retain the photomask 1 in a desired orientation and a laser supply unit 200. The region/stage is not specifically shown in the illustrated embodiments as any structure suitable for retaining the photomask in position during cleaning may be used, including a frame, vacuum retention mechanism or the like. The photomask cleaning apparatus may further include an air suction unit 400 and an end point determination unit 300.

The laser supply unit 200 irradiates a laser beam 260 to remove the pellicle adhesive residue 25 from the photomask 1. In other words, the pellicle adhesive residue 25 is removed by irradiating the laser beam 260 on the pellicle adhesive residue 25. In some embodiments, the laser beam 260 may have a wavelength ranging from about 193 nm to about 355 nm.

As shown in FIG. 4, in a case where the photomask 1 is formed of, e.g., a Cr substrate, if the laser irradiation is performed by using the laser beam 260 having a wavelength smaller than 193 nm, the reflectivity of the laser beam to Cr may be largely reduced, which may cause damage to the surface of the substrate of the photomask 1.

Further, if the laser beam 260 has a wavelength larger than 355 nm, a thermal removal process in which the substrate is heated by laser irradiation to liquefy or vaporize the residue 25 may be performed instead of a physical removal process in which the laser beam 260 is irradiated directly on the residue 25. Accordingly, it may cause thermal damage to the substrate. Therefore, the laser supply unit 200 of the photomask cleaning apparatus in accordance with some embodiments of the present inventive concept may irradiate the laser beam 260 having a wavelength ranging from about 193 nm to about 355 nm.

Further, in order to limit the damage to the substrate, the laser beam 260 may be irradiated by using a nanosecond pulse laser in some embodiments. For example, the laser beam 260 may be irradiated for a period from several ns to several tens ns. In some embodiments the laser beam 260 has a pulse duration ranging from about 1 ns to about 50 ns. When the pulse duration increases to several microseconds or more, thermal conduction may increase in the pellicle adhesive residue 25, which may reduce a control capability for the cleaning process and increase the risk of thermal damage.

However, the wavelength range and pulse duration of the laser beam 260 supplied from the laser supply unit 200 may be applied differently according to the type of the removal target substance 25 to be removed.

Further, conventionally, a method of immersing a photomask in sulfuric acid bath, or a method of rotating a photomask while injecting sulfuric acid was used in order to remove the removal target substance 25. In case of using sulfuric acid, the process generally causes residual contamination due to sulfate, thereby easily damaging the photomask and the pattern of the photomask.

On the other hand, in the photomask cleaning apparatus in accordance with some embodiments of the present inventive concept, the pellicle adhesive residue 25 may be substantially or even completely removed by using the laser beam 260 without using an additional cleaning solution, thereby reducing the risk of the photomask being damaged due to the cleaning solution, particularly, sulfuric acid. In other words, the photomask cleaning apparatus in accordance with some embodiments of the present inventive concept removes the removal target substance 25, more particularly, the pellicle adhesive residue 25, without performing an additional wet cleaning process. Accordingly, it is possible to clean the photomask while minimizing the damage to the photomask.

Referring again to FIG. 3, during the process for removing the residue 25, the photomask 1 may be arranged such that the pattern 15 is oriented in a gravity direction. Specifically, the photomask 1 may include a first surface on which the pattern 15 is formed and a second surface opposite to the first surface, and may be arranged such that the first surface is oriented in the gravity direction. References herein to the "gravity direction" refers to the direction of the arrow Gravity Force in FIG. 3. In other words, the "gravity direction" is with the face including the pattern 15 facing down so that particles released from the face including the pattern 15 will be induced by gravity to fall away from the face including the pattern 15. It will further be understood that the "gravity direction" need not be identical to the direction of gravity but includes a range of orientations allowing free release of particles without interference from any features of the photomask 1.

When the laser beam 260 is irradiated on the residue 25, debris of the residue 25 may be generated. Accordingly, in a case where the second surface, i.e., the surface opposite to the surface on which the pattern 15 is formed, is oriented in the gravity direction (i.e., the opposite of that shown in FIG. 3), the debris of the residue 25 affected by the gravity may float in the air and then fall onto the photomask 1. In this case, the photomask 1 may be contaminated by the debris of the residue 25. On the other hand, as shown in the drawing, in a case where the first surface on which the pattern 15 is formed is oriented in the gravity direction, the debris of the residue 25 may be induced to fall downward/away from the photomask 1 by gravity. Accordingly, it is possible to further limit or even prevent the photomask 1 from being contaminated by the debris.

The photomask cleaning apparatus may further include a residue inspection unit for inspecting a region in which the pellicle adhesive residue 25 exists. As shown in FIG. 5, before the laser supply unit 200 irradiates the laser beam 260, the residue inspection unit may inspect whether the pellicle adhesive residue 25 exists on the inspected region of the photomask 1. For example, the residue inspection unit may inspect a region in which the removal target substance 25 exists, for example, by scanning the second region of the photomask 1, particularly, a region on which the pellicle adhesive has been coated.

When the pellicle 2 is removed, the pellicle adhesive may be only partially removed with the pellicle 2. Accordingly, the substrate of the photomask 1 may be exposed. In other words, even in the region on which the pellicle adhesive has been coated, there may be a region 26 in which the residue of the pellicle adhesive does not exist on the surface of the substrate. As described above, the residue inspection unit may previously inspect the region in which the pellicle adhesive residue 25 exists, thereby selectively irradiating the laser beam 260 on the region which is proven to have the pellicle adhesive residue and allowing the laser beam 260 not to be activated otherwise.

Accordingly, it is possible to more quickly perform a residue removal process. Further, since it is unnecessary to irradiate the laser beam 260 on an entire region on which the pellicle adhesive has been coated, it is possible to reduce an amount of power used to irradiate the laser beam 260, thereby reducing the cost.

Further, as shown in FIGS. 3 and 6, the end point determination unit 300 may include an optical sensor 320 for detecting light 325 and/or a sound sensor 310 for detecting sound 315.

More specifically, when the pellicle adhesive residue is removed by irradiating the laser beam 260, plasma is formed and light and sound are generated. The optical sensor 320 may detect light of a surrounding area and give a command to stop the irradiation of the laser beam 260 of the laser supply unit 200 if the amount of the detected light is equal to or smaller than a critical value. The optical sensor 320 may be, e.g., a photo multiplier tube (PMT).

In the same way, the sound sensor 310 may detect the sound 315 of a surrounding area and give a command to stop the irradiation of the laser beam 260 of the laser supply unit 200 if the intensity of the detected sound is equal to or smaller than a critical value. The sound sensor 310 may be, e.g., an acoustic sensor.

Further, as shown in the drawing, the apparatus may include both the optical sensor 320 and the sound sensor 310 to determine an irradiation end point, or may include only one of the optical sensor 320 and the sound sensor 310.

As shown in FIG. 6, the laser supply unit 200 may include a laser beam source 210 for generating a laser beam 260*a*, an expander 220 for expanding the laser beam 260*a* generated from the laser beam source 210 to generate a laser beam 260*b*, a beam collimator 230 for collimating the laser beam 260*b* expanded by the expander 220 to generate a collimated laser beam 260*c*, a light path changing unit 240 for changing a light path of the collimated laser beam 260*c* to generate a laser beam 260*d* in a desired direction, and an output coupler 250 for irradiating the laser beam 260*d* whose path has been changed by the light path changing unit 240 to focus on a target. However, the illustrated embodiments of FIG. 6 are exemplary and the laser supply unit 200 may be installed in various forms in other embodiments.

Further, as shown in FIGS. 3 and 7, the suction unit 400 sucks surrounding air. As described above, when the pellicle adhesive residue 25 is removed by the laser beam 260, debris 405 of the residue 25 may be generated. As the generated debris 405 generally has a relatively small size and receives energy due to the irradiation of the laser beam, the debris 405 may scatter around. The debris 405 may be sucked into the suction unit 400 by a suction force of the suction unit 400 for sucking surrounding air without being seated on the photomask 1. Accordingly, it is possible to limit or even prevent secondary contamination of the photomask 1 due to the debris 405 of the residue 25.

Further, as shown in FIG. 7, the suction unit 400 may include a plurality of suction inlets 410 and 420 arranged, for example, in the illustrated symmetrical structure (i.e., inlets 410, 420 on substantially opposing sides of the laser target point). The debris 405 of the residue 25 may scatter in all directions at a point where the laser beam 260 is irradiated. Accordingly, the suction inlets 410 and 420 may be provided in plural number. In this case, a plurality of suction inlets 410 and 420 may be arranged in a symmetrical structure to balance the suction forces of the suction inlets 410 and 420.

As described above, in order to limit or even prevent the photomask 1 from being contaminated due to the debris 405 of the residue 25, the photomask 1 may be arranged such that the surface on which the pattern 15 is formed is oriented in the gravity direction. In some other embodiments, the suction unit 400 is provided. In some embodiments with the suction unit 400, the photomask 1 may be arranged such that the surface opposite to the surface on which the pattern 15 is formed is oriented in the gravity direction. That is, the photomask 1 may be arranged such that the surface on which the pattern 15 is formed becomes an upper surface, and at least one of the suction inlets 410 and 420 may be also installed to suck the debris 405 which floats in the air and could fall onto the photomask 1.

A cleaning method of a photomask in accordance with some embodiments of the present inventive concept will be now be further described with reference to FIG. 8. The pellicle 2 is removed from the photomask 1 (S10), and a region in which the pellicle adhesive residue exists on the photomask 1 may be inspected (S20).

The residue may then be removed by irradiating the laser beam on the inspected region (S30). An end point of the irradiation of the laser beam may be determined by detecting light and sound generated while the residue is removed by the laser beam. At the same time, surrounding air may be sucked by using at least one suction inlet such that debris generated when the residue is removed can be also removed.

When the irradiation of the laser beam on a specific region has been completed, a stage on which the photomask is loaded may be moved (S40). In some other embodiments, the laser supply unit may be moved to the next region in which the residue exists. After moving the stage or laser supply unit, a laser irradiation process is performed again. When the residue existing on the photomask has been completely removed by repeating the laser irradiation and stage moving steps, the photomask cleaning process may be completed (S50).

A residue existing on the pattern 15 formed on the photomask may be removed by the cleaning apparatus in accordance with some embodiments of the present inventive concept. In some other embodiments, a conventional cleaning apparatus and cleaning method may be applied to the pattern 15 formed on the photomask.

As described above, in the photomask cleaning apparatus and the photomask cleaning method using the same in accordance with some embodiments of the present inventive concept, there may be an advantage of completely removing the pellicle adhesive residue existing on the photomask by using a laser beam without using a cleaning solution.

Some embodiments of the present inventive concept provide a photomask cleaning apparatus capable of minimizing damage to a photomask. Some embodiments provide a cleaning method of a photomask using the photomask cleaning apparatus capable of minimizing damage to a photomask.

According to an aspect of some embodiments of the present inventive concept, there is provided a photomask cleaning apparatus including a photomask including a first region in which a pattern is formed, and a second region in which a pellicle adhesive residue exists, the second region being located outside the first region, and a laser supply unit which irradiates a laser beam on the pellicle adhesive residue to remove the pellicle adhesive residue.

According to another aspect of some embodiments of the present inventive concept, there is provided a photomask cleaning apparatus including a photomask including a first region in which a pattern is formed, and a second region in which a removal target substance exists, a laser supply unit which irradiates a laser beam to remove the removal target substance, and a suction unit for sucking surrounding air, wherein the suction unit sucks debris generated when the removal target substance is removed by the laser beam while sucking the surrounding air.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A photomask cleaning apparatus comprising:
a photomask receiving stage that is configured to receive and retain a photomask in a desired orientation, the photomask having a front face having a pellicle adhesive residue region thereon, wherein the desired orientation is with the front face positioned to allow gravity to move particles on the front face away from the front face without interference from the front face of the photomask;
a laser supply unit that is configured to generate a laser beam that irradiates a target region on the front face of the photomask to remove a pellicle adhesive residue from the target region, wherein the photomask cleaning apparatus is configured to move the target region on the front face of the photomask to irradiate the entire pellicle adhesive residue region; and
a residue inspection unit coupled to the laser supply unit that is configured to detect when the pellicle adhesive residue is present in the pellicle adhesive residue region and wherein the laser supply unit is configured to generate the laser beam only when the pellicle adhesive residue is detected by the residue inspection unit.

2. The photomask cleaning apparatus of claim 1, wherein the laser supply unit is configured to generate the laser beam having a wavelength selected to irradiate a selected pellicle adhesive residue material having a desired reflectivity to the selected pellicle adhesive residue material to limit damage caused to the photomask by the laser beam and to limit thermal removal of the pellicle adhesive residue and initiate a physical removal process that removes the pellicle adhesive residue.

3. The photomask cleaning apparatus of claim 2, wherein the wavelength is from about 193 nanometers (nm) to about 355 nm.

4. The photomask cleaning apparatus of claim 3, wherein the laser supply unit includes a nanosecond pulse laser that generates the laser beam to have a pulse duration from about 1 nanoseconds (ns) to about 50 ns to limit thermal damage to the photomask from the laser beam.

5. The photomask cleaning apparatus of claim 2, wherein the photomask cleaning apparatus is configured to completely remove the pellicle adhesive residue from the pellicle adhesive residue region using the laser supply unit without using an additional cleaning solution.

6. The photomask cleaning apparatus of claim 2, further comprising an endpoint determination unit coupled to the laser supply unit that is configured to detect when the laser beam has stopped removing the pellicle adhesive residue from the target region and wherein the laser supply unit is configured to stop generating the laser beam when the endpoint determination unit detects that the laser beam has stopped removing the pellicle adhesive residue from the target region.

7. The photomask cleaning apparatus of claim 6, wherein the endpoint determination unit comprises at least one of:
an optical sensor configured to detect light generated when the laser beam removes the pellicle adhesive residue; and
a sound sensor configured to detect sound generated when the laser beam removes the pellicle adhesive residue.

8. The photomask cleaning apparatus of claim 2, further comprising a suction unit proximate the target region that is configured to remove airborne debris generated when the laser beam removes the pellicle adhesive residue.

9. The photomask cleaning apparatus of claim 1, wherein the photomask includes a region in which a pattern is formed and wherein the pellicle adhesive region extends around at least a portion of the region in which the pattern is formed.

10. The photomask cleaning apparatus of claim 1, wherein the desired orientation is a gravity direction.

11. The photomask cleaning apparatus of claim 1, further comprising a stage moving unit configured to move the stage relative to the laser beam to move the target region on the front face of the photomask over the entire pellicle adhesive residue region.

12. A photomask cleaning apparatus comprising:
- a photomask receiving stage that is configured to receive and retain a photomask in a desired orientation, the photomask having a front face having a pellicle adhesive residue region thereon;
- a laser supply unit that is configured to generate a laser beam that irradiates a target region on the front face of the photomask to remove a pellicle adhesive residue from the target region, wherein the photomask cleaning apparatus is configured to move the target region on the front face of the photomask to irradiate the entire pellicle adhesive residue region;
- a suction unit proximate the target region that is configured to remove airborne debris generated when the laser beam removes the pellicle adhesive residue; and
- a residue inspection unit coupled to the laser supply unit that is configured to detect when the pellicle adhesive residue is present in the pellicle adhesive residue region and wherein the laser supply unit is configured to generate the laser beam only when the pellicle adhesive residue is detected by the residue inspection unit.

13. The photomask cleaning apparatus of claim 12, wherein the suction unit comprises a plurality of suction inlets arranged symmetrically proximate the target region.

14. The photomask cleaning apparatus of claim 12, wherein the laser supply unit is configured to generate the laser beam having a wavelength selected to irradiate a selected pellicle adhesive residue material having a desired reflectivity to the selected pellicle adhesive residue material to limit damage caused to the photomask by the laser beam and to limit thermal removal of the pellicle adhesive residue and initiate a physical removal process that removes the pellicle adhesive residue.

15. The photomask cleaning apparatus of claim 14, wherein the wavelength is from about 193 nanometers (nm) to about 355 nm and wherein the laser supply unit includes a nanosecond pulse laser that generates the laser beam to have a pulse duration from about 1 nanoseconds (ns) to about 50 ns to limit thermal damage to the photomask from the laser beam, wherein the photomask cleaning apparatus is configured to completely remove the pellicle adhesive residue from the pellicle adhesive residue region using the laser supply unit without using an additional cleaning solution.

16. The photomask cleaning apparatus of claim 12, further comprising an endpoint determination unit coupled to the laser supply unit that is configured to detect when the laser beam has stopped removing the pellicle adhesive residue from the target region and wherein the laser supply unit is configured to stop generating the laser beam when the endpoint determination unit detects that the laser beam has stopped removing the pellicle adhesive residue from the target region.

17. The photomask cleaning apparatus of claim 12, wherein the suction unit is configured to suck the debris generated when the laser beam removes the pellicle adhesive residue while sucking the surrounding air.

* * * * *